(12) United States Patent
Takagiwa et al.

(10) Patent No.: US 11,699,764 B2
(45) Date of Patent: Jul. 11, 2023

(54) SEMICONDUCTOR DEVICE AND METHOD OF MANUFACTURING THE SAME

(71) Applicant: FUJI ELECTRIC CO., LTD., Kawasaki (JP)

(72) Inventors: Kazumi Takagiwa, Matsumoto (JP); Hitoshi Sumida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/589,171

(22) Filed: Jan. 31, 2022

(65) Prior Publication Data
US 2022/0285563 A1 Sep. 8, 2022

(30) Foreign Application Priority Data
Mar. 8, 2021 (JP) .................................. 2021-36540

(51) Int. Cl.
*H01L 29/808* (2006.01)
*H01L 29/417* (2006.01)
*H01L 29/423* (2006.01)
*H01L 29/66* (2006.01)

(52) U.S. Cl.
CPC ........ *H01L 29/808* (2013.01); *H01L 29/4175* (2013.01); *H01L 29/42312* (2013.01); *H01L 29/66681* (2013.01)

(58) Field of Classification Search
CPC ............... H01L 29/808; H01L 29/4175; H01L 29/42312; H01L 29/66681; H01L 29/0696; H01L 29/402; H01L 29/7393; H01L 29/7835; H01L 29/66325; H01L 29/0615; H01L 29/7816
See application file for complete search history.

(56) References Cited

U.S. PATENT DOCUMENTS

| 7,282,765 B2 * | 10/2007 | Xu ..................... H01L 29/41766 |
| | | 257/E29.066 |
| 9,136,326 B2 | 9/2015 | Yamaji |
| 2010/0001342 A1 | 1/2010 | Furuhata |
| 2010/0315159 A1 * | 12/2010 | Kocon ................ H01L 29/7835 |
| | | 257/E21.409 |
| 2014/0197491 A1 | 7/2014 | Yamaji |

FOREIGN PATENT DOCUMENTS

| JP | 4645861 B2 | 12/2010 |
| JP | 2014138091 A | 7/2014 |

* cited by examiner

*Primary Examiner* — Mohammed R Alam

(57) ABSTRACT

A semiconductor device includes: a semiconductor layer of a first conductivity-type; a well region of a second conductivity-type provided at an upper part of the semiconductor layer; a base region of the second conductivity-type provided at an upper part of the well region; a carrier supply region of the first conductivity-type provided at an upper part of the base region; a drift region of the first conductivity-type provided separately from the base region; a carrier reception region of the first conductivity-type provided at an upper part of the drift region; a gate electrode provided on a top surface of the well region interposed between the base region and the drift region via a gate insulating film; and a punch-through prevention region of the second conductivity-type provided at the upper part of the well region and having an impurity concentration different from the impurity concentration of the base region.

10 Claims, 29 Drawing Sheets

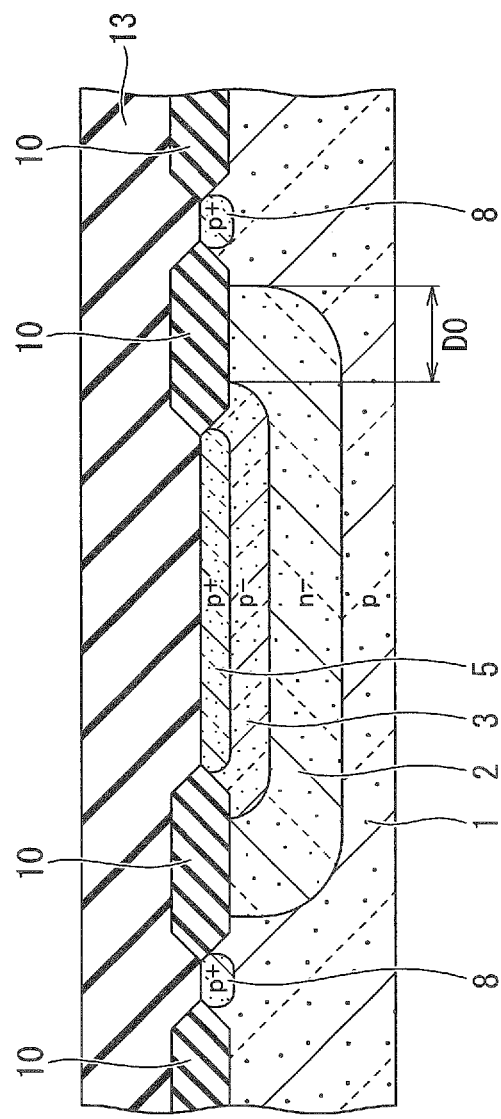

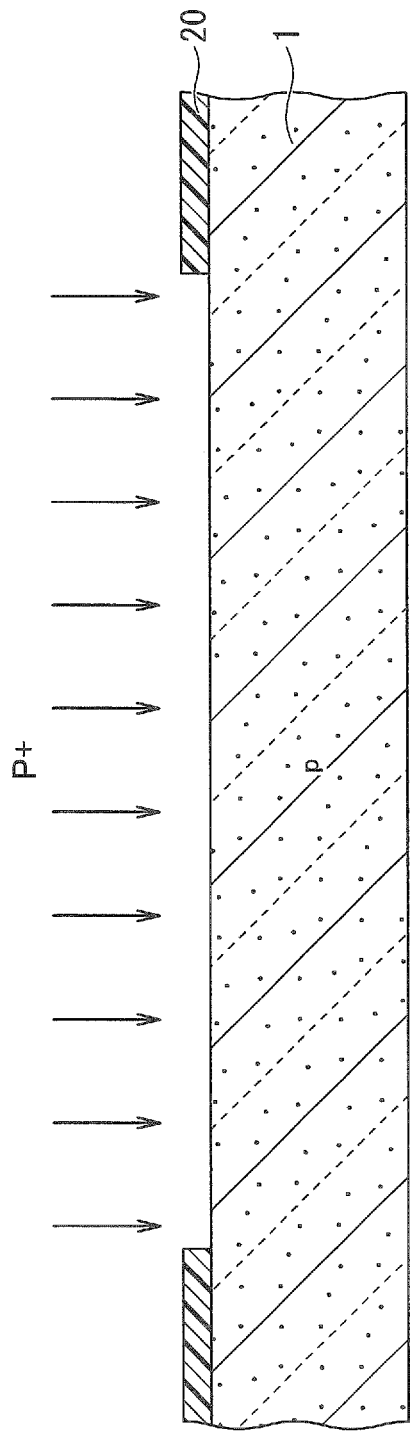

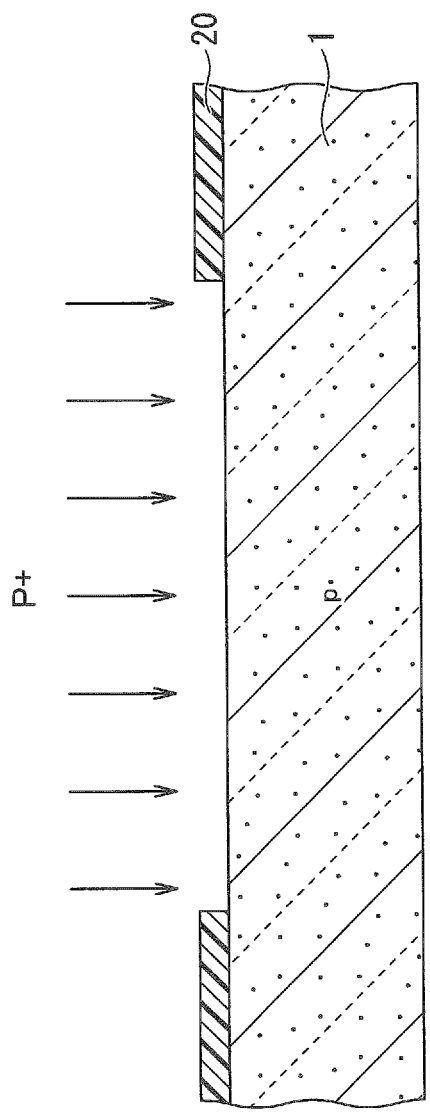

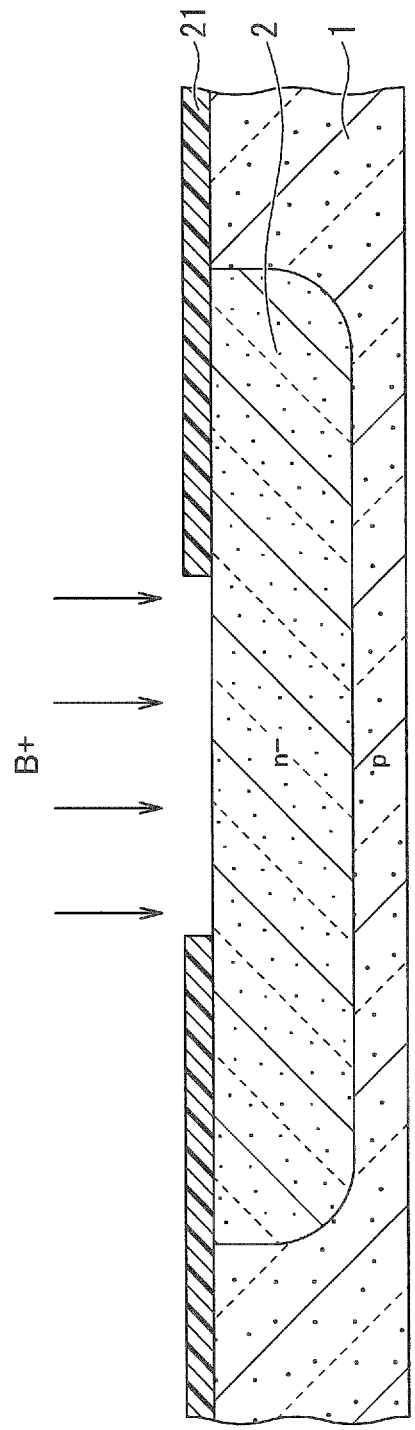

SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2021-36540 filed on Mar. 8, 2021, the entire contents of which are incorporated by reference herein.

BACKGROUND

1. Field of the Invention

The present invention relates to a semiconductor device and a method of manufacturing the semiconductor device.

2. Description of the Related Art

A lateral diffusion MOS transistor (referred to below as a "LDMOS") is one of semiconductor devices typically used for a high breakdown voltage. The LDMOS relaxes an intensity of an electric field when a high voltage is applied by a drift region having a relatively low impurity concentration provided between a source region and a drain region so as to achieve a high-breakdown voltage (refer to JP 4645861 B and JP 2014-138091 A).

When the LDMOS is a p-channel, a well region of n-type is formed due to element isolation. The n-type well region is formed deeply in a semiconductor substrate of p-type so as to ensure sufficient isolation breakdown voltage. An impurity concentration of the n-type well region is regulated as appropriate depending on a breakdown voltage or an ON-resistance of the semiconductor device.

The impurity concentration of the n-type well region tends to be decreased as the element breakdown voltage of the LDMOS is increased. When the impurity concentration of the n-type well region is decreased, a depletion layer tends to spread between the drain region and the semiconductor substrate to cause punch-through, which may cause a decrease in the breakdown voltage between the drain region and the semiconductor substrate.

Increasing the distance sufficiently between the drain region and the semiconductor substrate inevitably increases the size of the device to increase the size of the chip, leading to an increase in cost accordingly.

SUMMARY

In view of the foregoing problems, the present invention provides a semiconductor device and a method of manufacturing the semiconductor device capable of ensuring a breakdown voltage while avoiding an increase in chip size.

An aspect of the present invention inheres in a semiconductor device including: a semiconductor layer of a first conductivity-type; a well region of a second conductivity-type provided at an upper part of the semiconductor layer; a base region of the second conductivity-type provided at an upper part of the well region and having an impurity concentration higher than an impurity concentration of the well region; a carrier supply region of the first conductivity-type provided at an upper part of the base region; a drift region of the first conductivity-type provided at the upper part of the well region separately from the base region; a carrier reception region of the first conductivity-type provided at an upper part of the drift region and having an impurity concentration than an impurity concentration of the drift region; a gate electrode provided on a top surface of the well region interposed between the base region and the drift region via a gate insulating film; and a punch-through prevention region of the second conductivity-type provided at the upper part of the well region and having an impurity concentration higher than the impurity concentration of the well region and different from the impurity concentration of the base region.

Another aspect of the present invention inheres in a method of manufacturing a semiconductor device, the method including: forming a well region of a second conductivity-type at an upper part of a semiconductor layer of a first conductivity-type; forming a base region of the second conductivity-type having an impurity concentration higher than an impurity concentration of the well region at an upper part of the well region; forming a punch-through prevention region of the second conductivity-type, at the upper part of the well region, having an impurity concentration higher than the impurity concentration of the well region and different from the impurity concentration of the base region; forming a drift region of the first conductivity-type at the upper part of the well region separately from the base region; forming a carrier supply region of the first conductivity-type at an upper part of the base region; forming a carrier reception region of the first conductivity-type having an impurity concentration higher than an impurity concentration of the drift region at an upper part of the drift region; and forming a gate electrode on a top surface of the well region interposed between the base region and the drift region via a gate insulating film.

BRIEF DESCRIPTION OF THE DRAWINGS

FIG. 4 is a cross-sectional view of a semiconductor device of a comparative example;

FIG. 5A is a cross-sectional process view corresponding to FIG. 2 for explaining a method of manufacturing the semiconductor device according to the embodiment of the present invention;

FIG. 5B is a cross-sectional process view corresponding to FIG. 3 for explaining the method of manufacturing the semiconductor device according to the embodiment of the present invention;

FIG. 7A is a cross-sectional process view continued from FIG. 6A for explaining the method of manufacturing the semiconductor device according to the embodiment of the present invention;

DETAILED DESCRIPTION

Figure 1:
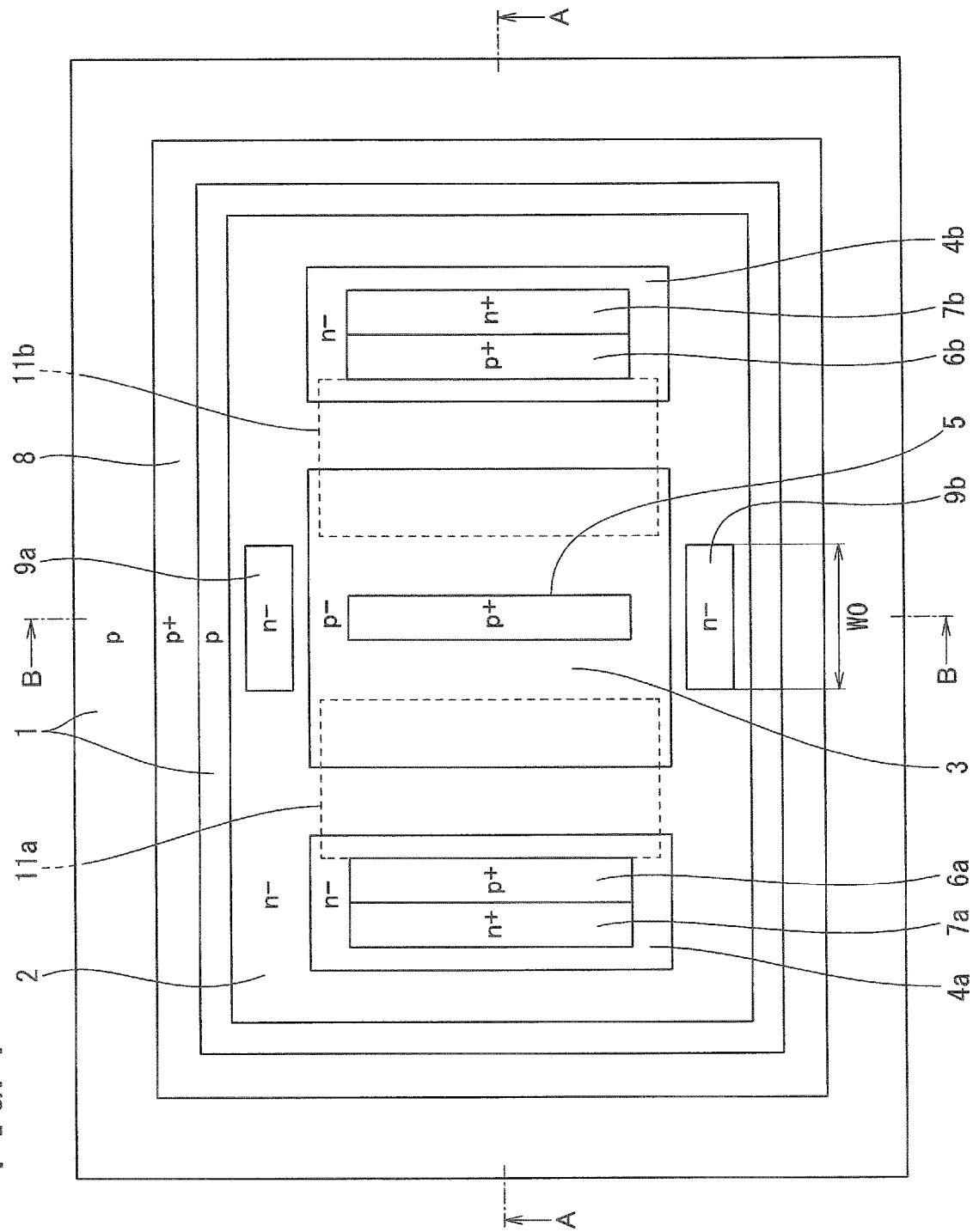
FIG. 1 is a plan view illustrating a semiconductor device according to an embodiment of the present invention.

With reference to the Drawings, an embodiment and modified examples of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiment and modified examples described below merely illustrate schematically devices and methods for specifying and giving shapes to the technical idea of the present invention, and the span of the technical idea is not limited to materials, shapes, structures, and relative positions of elements described herein.

In the Specification, a "carrier supply region" means a semiconductor region which supplies majority carriers as a main current. The carrier supply region is assigned to a semiconductor region which will be a source region in a MIS field-effect transistor (MISFET) or a MIS static induction transistor (MISSIT), an emitter region in an insulated-gate bipolar transistor (IGBT), and an anode region in a MIS controlled static induction thyristor (MIS controlled SI thyristor).

A "carrier reception region" means a semiconductor region which receive the majority carriers as the main current. The carrier reception region is assigned to a semiconductor region which will be the drain region in the MISFET or the MISSIT, the collector region in the IGBT, and the cathode region in the MIS controlled SI thyristor. In a semiconductor device having a bipolar type operation such as the IGBT or the MIS controlled SI thyristor, carriers of a conductivity-type opposite to the majority carries are injected from the carrier reception region.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an p-type and a second conductivity-type is a n-type. However, the relationship of the conductivity-types may be inverted to set the first conductivity-type to the n-type and the second conductivity-type to the p-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

Embodiment

<Configuration of Semiconductor Device>

Figure 2:
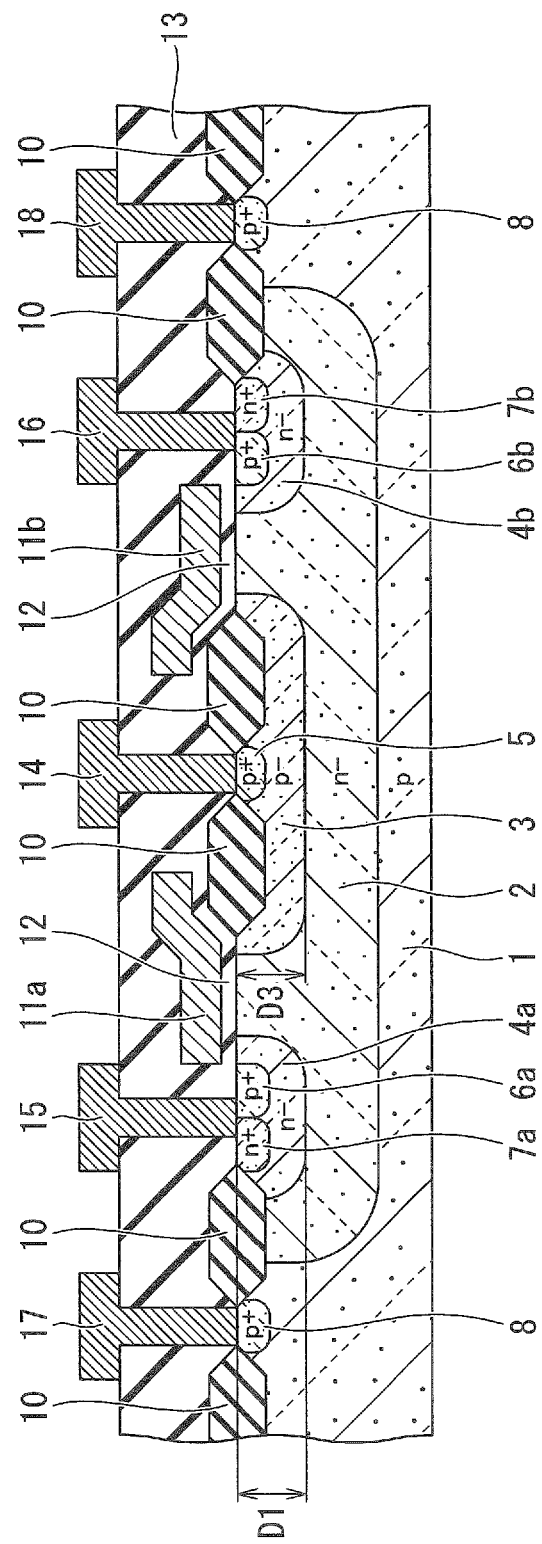
FIG. 2 is a cross-sectional view as viewed from direction A-A in FIG. 1.
Figure 3:
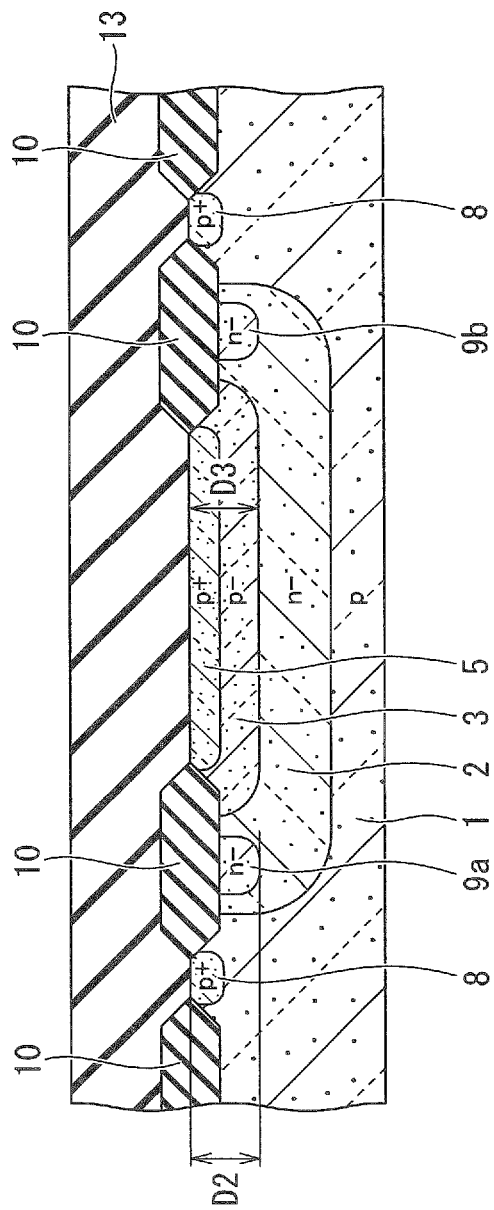
FIG. 3 is a cross-sectional view as viewed from direction B-B in FIG. 1.

FIG. 1 is a plan view illustrating a semiconductor device according to an embodiment of the present invention. FIG. 2 corresponds to a cross-sectional view as viewed from direction A-A in FIG. 1. FIG. 3 corresponds to a cross-sectional view as viewed from direction B-B in FIG. 1. FIG. 1 corresponds to a plan view of a semiconductor layer 1 while omitting an element isolation insulating film 10, a gate insulating film 12, gate electrodes 11a and 11b, an interlayer insulating film 13, a drain electrode 14, source electrodes 15 and 16, and substrate contact electrodes 17 and 18 provided on the semiconductor layer 1 illustrated in FIG. 2 and FIG. 3 for reasons of convenience. FIG. 1 schematically indicates the gate electrodes 11a and 11b illustrated in FIG. 2 by the broken lines for illustration purposes.

The semiconductor device according to the embodiment of the present invention includes the semiconductor layer 1 of a first conductivity-type (p-type), and a well region 2 of a second conductivity-type (n⁻-type) provided at an upper part of the semiconductor layer 1.

The semiconductor layer 1 to be used may be a semiconductor substrate such as a silicon (Si) substrate. The semiconductor layer 1 may also be a semiconductor substrate made of a semiconductor (a wide band-gap semiconductor) having a greater band gap than Si, such as silicon carbide (SiC), gallium nitride (GaN), diamond, and aluminum nitride (AlN). The semiconductor layer 1 may be a semiconductor region of p-type provided at an upper part of a semiconductor substrate of p-type or n-type.

As illustrated on the left in FIG. 1 and FIG. 2, a base region (a channel-formation region) 4a of n⁻-type having a higher impurity concentration than the well region 2 is provided at an upper part of the well region 2. A carrier supply region (a source region) 6a of p⁺-type is provided at an upper part of the base region 4a. A contact region 7a of n⁺-type having a higher impurity concentration than the base region 4a is provided at the upper part of the base region 4a so as to be in contact with the source region 6a. As illustrated in FIG. 1, the source region 6a and the contact region 7a each have a stripe-shaped planar pattern, and extend in the upper-lower direction in FIG. 1. As illustrated in FIG. 2, the source electrode 15 is connected to the respective top surfaces of the source region 6a and the contact region 7a.

As illustrated on the right in FIG. 1 and FIG. 2, a base region 4b of n⁻-type having a higher impurity concentration than the well region 2 is provided at an upper part of the well region 2. A source region 6b of p⁺-type is provided at an upper part of the base region 4b. A contact region 7b of n⁺-type having a higher impurity concentration than the base region 4b is provided at the upper part of the base region 4b so as to be in contact with the source region 6b. As illustrated in FIG. 1, the source region 6b and the contact region 7b each have a stripe-shaped planar pattern, and extend in the upper-lower direction in FIG. 1. As illustrated in FIG. 2, the source electrode 16 is connected to the respective top surfaces of the source region 6b and the contact region 7b.

As illustrated in the middle in the right-left direction in FIG. 1 to FIG. 3, a carrier transport region (a drift region) 3 of p⁻-type is provided at an upper part of the well region 2. A carrier reception region (a drain region) 5 of p⁺-type having a higher impurity concentration than the drift region 3 is provided at an upper part of the drift region 3. As illustrated in FIG. 1, the well region 2 has a rectangular planar pattern. The drain region 5 has a stripe-shaped planar pattern, and extends in the upper-lower direction in FIG. 1.

The drain region 5 is opposed to the respective source regions 6a and 6b so as to interpose the well region 2 and the drift region 3 in the right-left direction in FIG. 1. The semiconductor device according to the embodiment of the present invention thus includes the two p-channel LDMOSs symmetrically arranged on the right and left sides, and the two LDMOSs share the drain region 5. The semiconductor layer 1 may be provided with various kinds of semiconductor elements such as a transistor integrated together in addition to the two LDMOSs. As illustrated in FIG. 2, the drain electrode 14 is connected to the top surface of the drain region 5.

As illustrated in FIG. 2 and FIG. 3, the element isolation insulating film 10 is provided on the top surface of the semiconductor layer 1. The element isolation insulating film 10 is a field oxide film such as a film of local oxidation of silicon (a LOCOS film) selectively (locally) formed by a silicon local oxidation (LOCOS) method, for example.

As illustrated on the left in FIG. 1 and FIG. 2, the gate electrode 11a is deposited via the gate insulating film 12 on the top surfaces of the base region 4a and the well region 2 interposed between the source region 6a and the drift region 3. As illustrated on the right in FIG. 1 and FIG. 2, the gate electrode 11b is deposited via the gate insulating film 12 on the top surfaces of the base region 4b and the well region 2 interposed between the source region 6b and the drift region 3.

The gate insulating films 12 as used herein can be a silicon oxide film (a $SiO_2$ film), for example, and other examples other than the $SiO_2$ film include a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film. Further, two or more of these layers listed above may be chosen and stacked on one another so as to be used as a composite film.

A material used for the gate electrodes 11a and 11b may be a polysilicon layer (a doped polysilicon layer) with which p-type impurity ions such as boron (B) or n-type impurity ions such as phosphorus (P) are heavily doped, or a refractory metal, for example.

The interlayer insulating film 13 is deposited on the gate electrodes 11a and 11b. The interlayer insulating film 13 to be used may be a silicon oxide film (a $SiO_2$ film) without containing phosphorus (P) or boron (B) which is referred to as a non-doped silicate glass (NSG) film. The interlayer insulating film 13 may also be a phosphosilicate glass film (a PSG film), a borosilicate glass film (a BSG film), a single-layer film of a borophosphosilicate glass film (a BPSG film) or a silicon nitride ($Si_3N_4$) film, or a composite film of any of the above films combined together.

As illustrated in FIG. 1 to FIG. 3, a substrate contact region 8 of p⁺-type is provided at an upper part of the semiconductor layer 1 so as to surround the circumference of the drift region 3. As illustrated in FIG. 1, the substrate contact region 8 has a ring-shaped planar pattern, for example. As illustrated in FIG. 2, the substrate contact electrodes 17 and 18 are connected to the top surface of the substrate contact region 8. A substrate potential (such as a ground potential) is applied to the substrate contact region 8 via the substrate contact electrodes 17 and 18, and the semiconductor layer 1 is fixed to the substrate potential.

As illustrated in FIG. 1 and FIG. 3, punch-through prevention regions 9a and 9b of n⁻-type having a higher impurity concentration than the well region 2 are provided at upper parts of the well region 2. The punch-through prevention regions 9a and 9b have a function of preventing punch-through between the drain region 5 and the semiconductor layer 1. While FIG. 1 and FIG. 3 illustrate the case in which the punch-through prevention regions 9a and 9b are separated from the drift region 3, the punch-through prevention regions 9a and 9b may be in contact with the drift region 3. As illustrated in FIG. 1, the punch-through prevention regions 9a and 9b are provided in a region interposed between the drain region 5 and the semiconductor layer 1 opposed to each other in the upper-lower direction in FIG. 1. The punch-through prevention regions 9a and 9b are arranged to interpose the drain region 5 and the drift region 3. A width W0 of the punch-through prevention regions 9a and 9b in the right-left direction in FIG. 1 is greater than the width of the drain region 5.

The punch-through prevention regions 9a and 9b have a higher impurity concentration than the well region 2 and have a lower impurity concentration than the base regions 4a and 4b. In the embodiment of the present invention, a depth D2 of the punch-through prevention regions 9a and 9b is equal to a depth D1 of the base regions 4a and 4b. The depth D2 of the punch-through prevention regions 9a and 9b may be shallower than the depth D1 of the base regions 4a and 4b. As described below, the punch-through prevention regions 9a and 9b and the base regions 4a and 4b are formed simultaneously in the same ion implantation step and the same annealing step.

The depth D2 of the punch-through prevention regions 9a and 9b is equal to a depth D3 of the drift region 3. The depth D2 of the punch-through prevention regions 9a and 9b may be either greater than or shallower than the depth D3 of the drift region 3.

First Comparative Example

A semiconductor device of a first comparative example is described below. FIG. 4 is a cross-sectional view of the semiconductor device of the first comparative example corresponding to FIG. 3 illustrating the semiconductor device according to the embodiment of the present invention. As illustrated in FIG. 4, the semiconductor device of the first comparative example differs from the semiconductor device according to the embodiment of the present invention in not including the punch-through regions provided at the upper parts of the well region 2.

The semiconductor device of the first comparative example has a problem of spreading a deletion layer from the p⁻-type drift region 3 toward the n⁻-type well region 2 to reach the p-type semiconductor layer 1 if the impurity concentration of the well region 2 is low, which causes punch-through between the drain region 5 and the semiconductor layer 1 to decrease the breakdown voltage. Increasing the distance D0 of the well region 2 sufficiently so as to prevent the punch-through inevitably increases the area of the device, leading to an increase in chip area to increase the costs accordingly.

The semiconductor device according to the embodiment of the present invention, which includes the punch-through prevention regions 9a and 9b provided at the upper parts of the well region 2 as illustrated in FIG. 1 and FIG. 3, can prevent the punch-through between the drain region 5 and the semiconductor layer 1, and avoid an increase in device area and an increase in chip area, so as to lead to a reduction in manufacturing cost accordingly.

Second Comparative Example

A semiconductor device of a second comparative example is described below. The semiconductor device of the second comparative example has a structure similar to the semiconductor device according to the embodiment of the present invention illustrated in FIG. 1 to FIG. 3, but differs in that the punch-through prevention regions 9a and 9b have substantially the same impurity concentration as the base regions 4a and 4b. In the semiconductor device of the second comparative example, the ions are implanted to the punch-through prevention regions 9a and 9b in association with the ion implantation step for forming the base regions 4a and 4b, so as to simultaneously form the base regions 4a and 4b and the punch-through prevention regions 9a and 9b in the subsequent annealing step. However, the ion implantation step for forming the base regions 4a and 4b, which uses the implantation conditions set to be suitable for the impurity concentration of the base regions 4a and 4b, may be improper for the impurity concentration of the punch-through prevention regions 9a and 9b.

The semiconductor device according to the embodiment of the present invention uses the impurity concentration of the punch-through prevention regions 9a and 9b different from the impurity concentration of the base regions 4a and 4b in the same device, so as to adjust the impurity concentration of the punch-through prevention regions 9a and 9b suitable for the prevention of the punch-through.

<Method of Manufacturing Semiconductor Device>

A method of manufacturing the semiconductor device according to the embodiment of the present invention is described below with reference to FIG. 5A to FIG. 12B. The manufacturing method is described below while focusing on the cross section of the semiconductor device illustrated in FIG. 2 and FIG. 3. The method of manufacturing the semiconductor device described below is an example, and it should be understood that the semiconductor device can be manufactured by any other methods including modified examples of this embodiment within the scope of the appended claims.

Figure 6A:
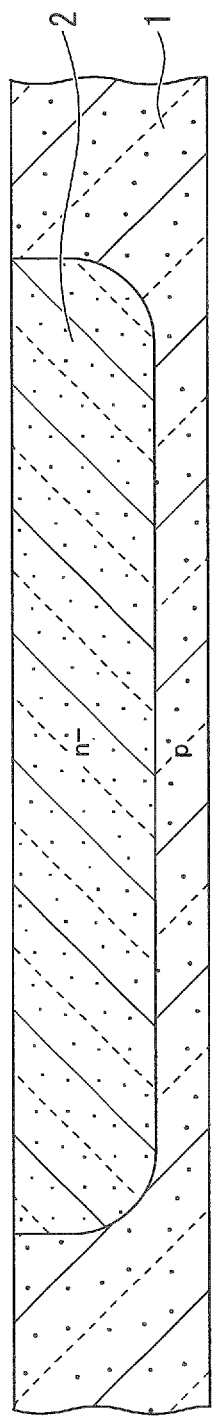
FIG. 6A is a cross-sectional process view continued from FIG. 5A for explaining the method of manufacturing the semiconductor device according to the embodiment of the present invention.
Figure 6B:
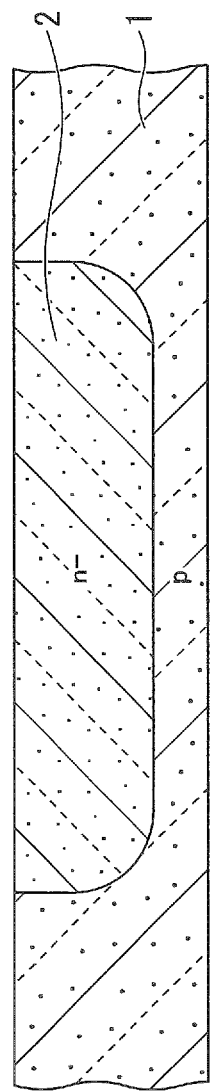
FIG. 6B is a cross-sectional process view continued from FIG. 5B for explaining the method of manufacturing the semiconductor device according to the embodiment of the present invention.

First, the semiconductor layer 1 such as a p-type Si substrate is prepared. A photoresist film 20 is then applied on the top surface of the semiconductor layer 1, and the photoresist film 20 is delineated by photolithography. As illustrated in FIG. 5A and FIG. 5B, using the delineated photoresist film 20 as a mask, n-type impurity ions such as phosphorus (P) are implanted. The execution of the annealing after the removal of the photoresist film 20 activates the n-type impurity ions. The n⁻-type well region 2 is thus selectively formed at the upper part of the semiconductor layer 1, as illustrated in FIG. 6A and FIG. 6B.

Figure 7B:
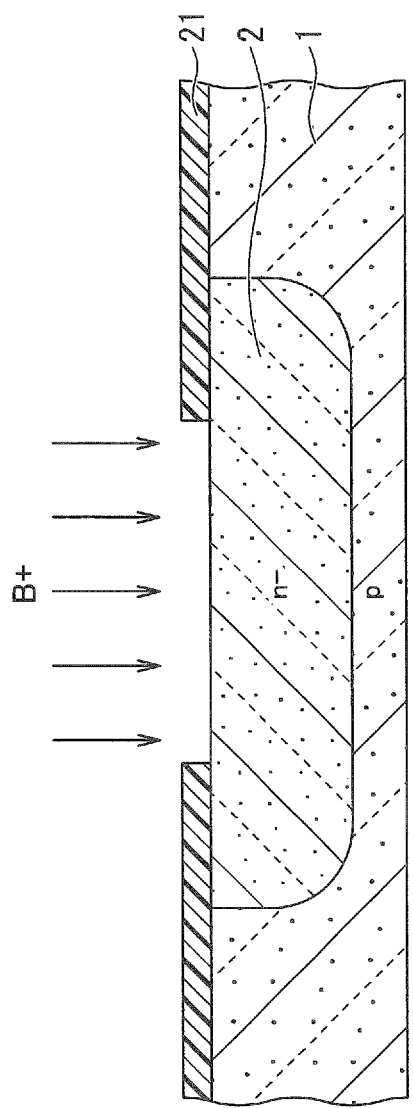
FIG. 7B is a cross-sectional process view continued from FIG. 6B for explaining the method of manufacturing the semiconductor device according to the embodiment of the present invention.

A photoresist film 21 is then applied on the respective top surfaces of the semiconductor layer 1 and the well region 2, and the photoresist film 21 is delineated by photolithography. As illustrated in FIG. 7A and FIG. 7B, using the delineated photoresist film 21 as a mask, p-type impurity ions such as boron (B) are implanted. Another photoresist film 22 is further applied on the respective top surfaces of the semiconductor layer 1 and the well region 2 after the removal of the photoresist film 21, and the photoresist film 22 is then delineated by photolithography, as illustrated in FIG. 8A.

Figure 8A:
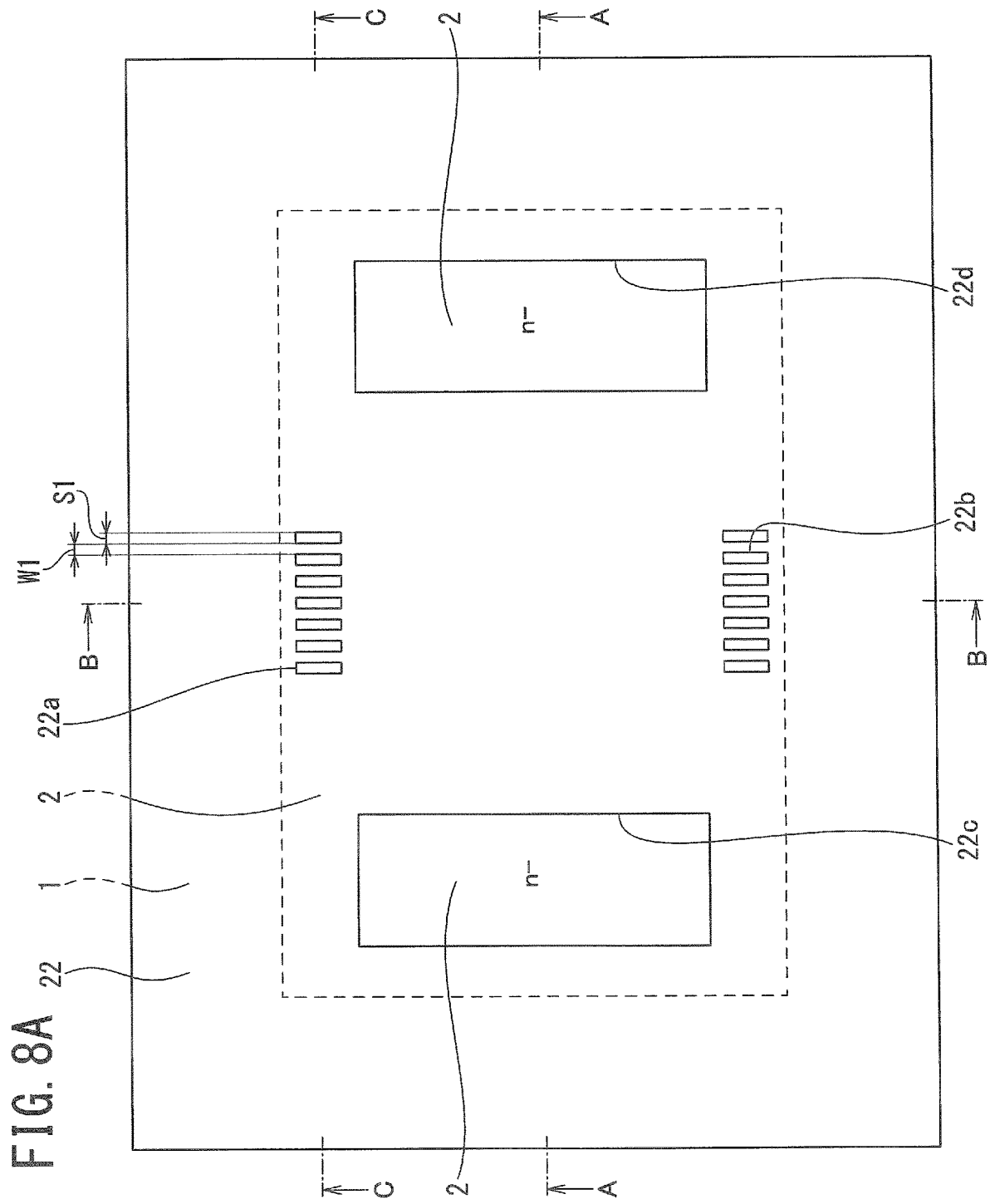
FIG. 8A is a plan view continued from FIG. 7A and FIG. 7B for explaining the method of manufacturing the semiconductor device according to the embodiment of the present invention.
Figure 8B:
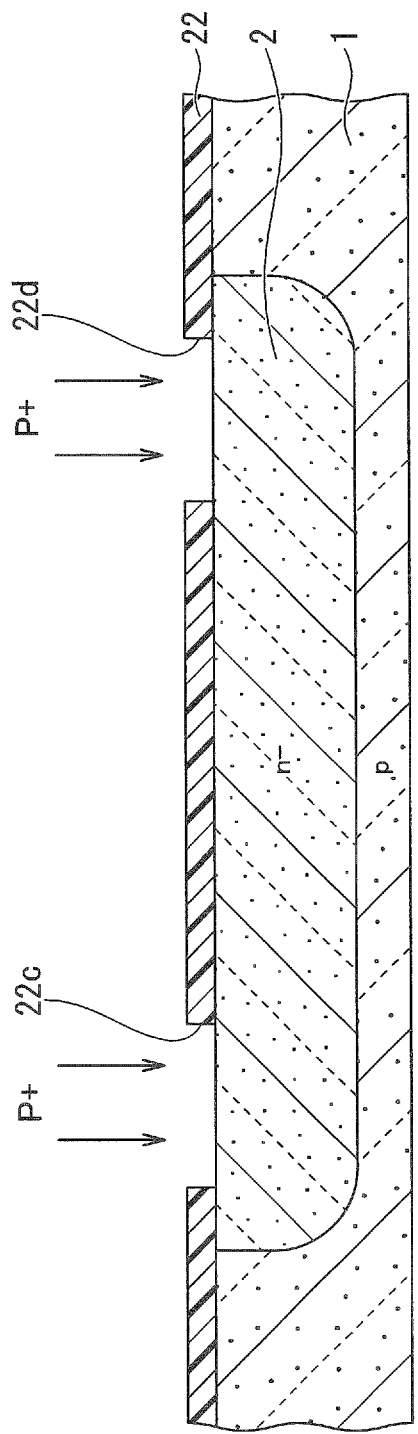
FIG. 8B is a cross-sectional view as viewed from direction A-A in FIG. 8A.
Figure 8C:
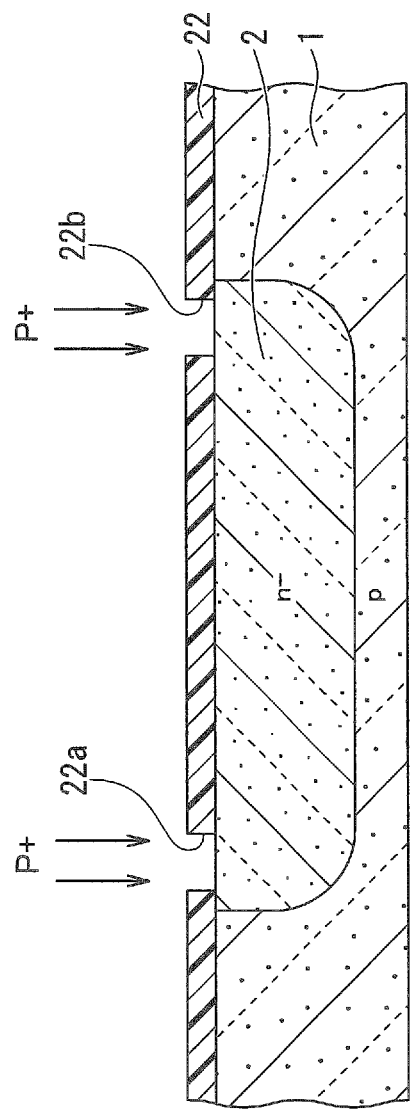
FIG. 8C is a cross-sectional view as viewed from direction B-B in FIG. 8A.
Figure 8D:
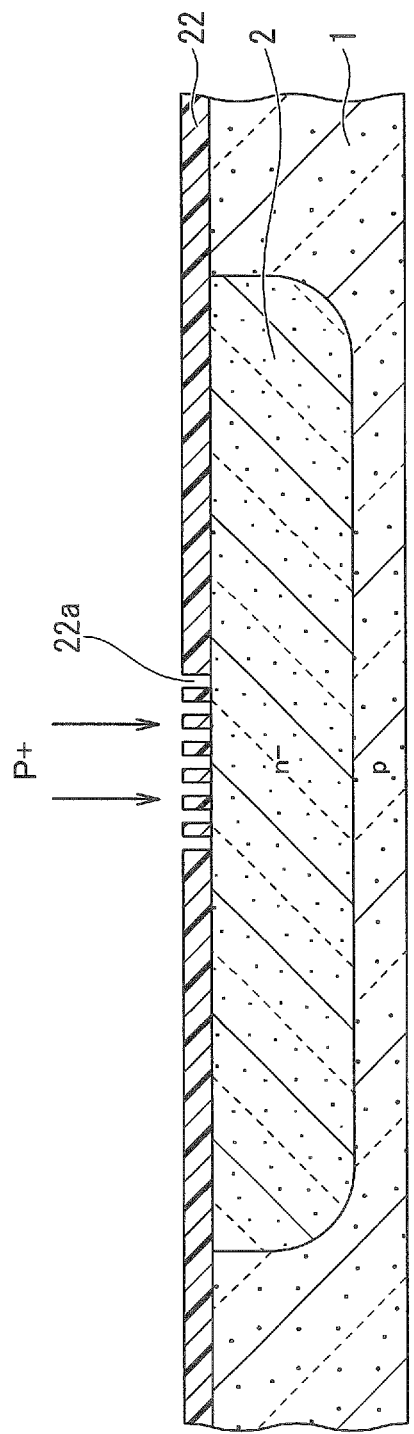
FIG. 8D is a cross-sectional view as viewed from direction C-C in FIG. 8A.

FIG. 8B is a cross-sectional view as viewed from direction A-A in FIG. 8A, FIG. 8C is a cross-sectional view as viewed from direction B-B in FIG. 8A, and FIG. 8D is a cross-sectional view as viewed from direction C-C in FIG. 8A. As illustrated in FIG. 8A, the resist pattern of the photoresist film 22 has openings 22a and 22b formed into slits (stripes) corresponding to the punch-through prevention regions 9a and 9b, and openings 22c and 22d whole opened into a rectangular shape corresponding to the respective base regions 4a and 4b. The slits of the openings 22a and 22b extend in the upper-lower direction in FIG. 8A, and are arranged next to each other in the right-left direction in FIG. 8A.

As illustrated in FIG. 8B to FIG. 8D, using the delineated photoresist film 22 as a mask for ion implantation, n-type impurity ions such as phosphorus (P) are implanted. The ion implantation conditions at this point are set to the conditions suitable for the base regions 4a and 4b. The openings 22c and 22d for forming the base regions 4a and 4b are thus whole opened so as to be subjected to the ion implantation, as illustrated in FIG. 8B. As illustrated in FIG. 8C and FIG. 8D, since the openings 22a and 22b for forming the punch-through prevention regions 9a and 9b are formed into slits, the implanted amount of the ions is regulated, so as to adjust the impurity concentration of the punch-through prevention regions 9a and 9b to be suitable for the prevention of the punch-through.

As illustrated in FIG. 8A, a density (a shielding rate) of the slits of the openings 22a and 22b, a slit width (a width of not-open parts) W1 of the openings 22a and 22b, a slit gap (a width of the openings) S1, and a ratio S1/W1 of the slit gap S1 to the slit width W1 are regulated, so as to adjust the impurity concentration of the punch-through prevention regions 9a and 9b to be suitable for the prevention of the punch-through. As the shielding rate of the slits of the openings 22a and 22b is higher, the impurity concentration of the punch-through prevention regions 9a and 9b is less, and the depth of the punch-through prevention regions 9a and 9b is shallower. For example, when the shielding rate of the openings 22a and 22b is set to about 50%, the slit width W1 is set to about 0.5 μm, the slit gap S1 is set to about 0.5 μm, and the ratio S1/W1 of the slit gap S1 to the slit width W1 is set to about one, the impurity concentration of the punch-through prevention regions 9a and 9b can be adjusted to be about half of the impurity concentration of the base regions 4a and 4b. The photoresist film 22 is then removed after the implantation of the n-type impurity ions illustrated in FIG. 8B to FIG. 8D.

Figure 9A:
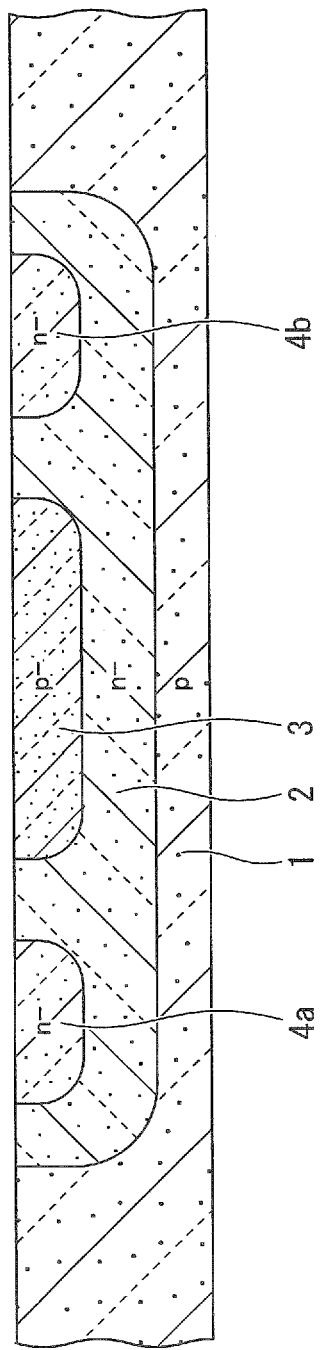
FIG. 9A is a cross-sectional process view continued from FIG. 8B for explaining the method of manufacturing the semiconductor device according to the embodiment of the present invention.
Figure 9B:
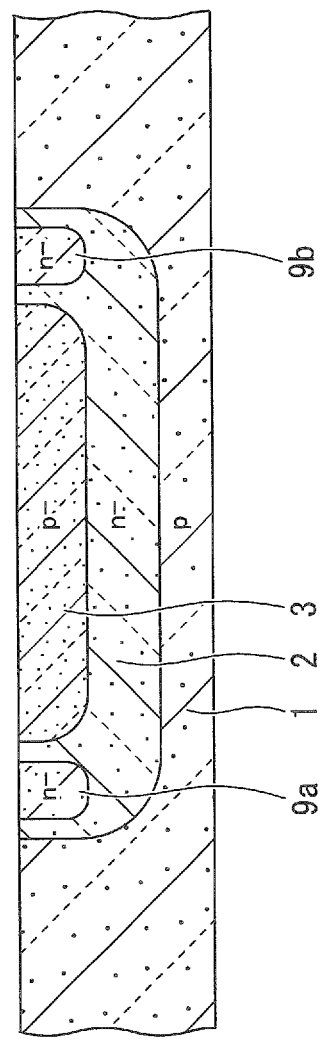
FIG. 9B is a cross-sectional process view continued from FIG. 8C for explaining the method of manufacturing the semiconductor device according to the embodiment of the present invention.

The execution of the subsequent annealing activates the p-type impurity ions and the n-type impurity ions. The $p^-$-type drift region 3 is thus selectively formed at the upper part of the well region 2, as illustrated in FIG. 9A and FIG. 9B. The $n^-$-type punch-through prevention regions 9a and 9b and the $n^-$-type base regions 4a and 4b are further selectively formed at the upper part of the well region 2. The punch-through prevention regions 9a and 9b are regions in which the n-type impurity ions implanted through the slits of the openings 22a and 22b are diffused in the lateral direction so as to be evenly mixed together. The impurity concentration of the punch-through prevention regions 9a and 9b is different from and lower than the impurity concentration of the base regions 4a and 4b. The annealing for forming the $p^-$-type drift region 3 and the annealing for forming the $n^-$-type punch-through prevention regions 9a and 9b and the $n^-$-type base regions 4a and 4b are not necessarily executed in the same step, and the respective annealing steps may be executed independently of each other.

Figure 10A:
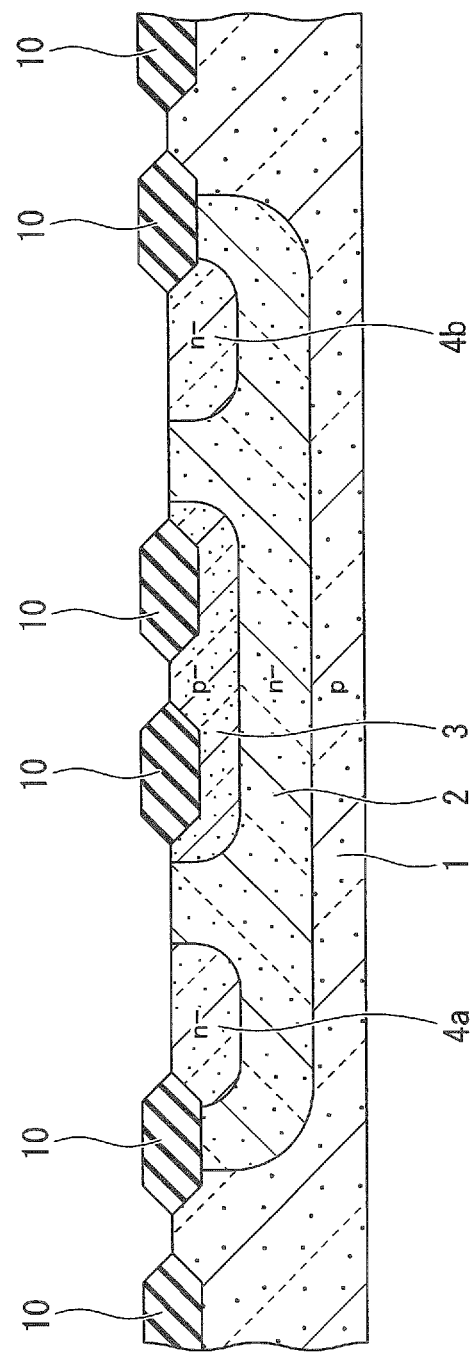
FIG. 10A is a cross-sectional process view continued from FIG. 9A for explaining the method of manufacturing the semiconductor device according to the embodiment of the present invention.
Figure 10B:
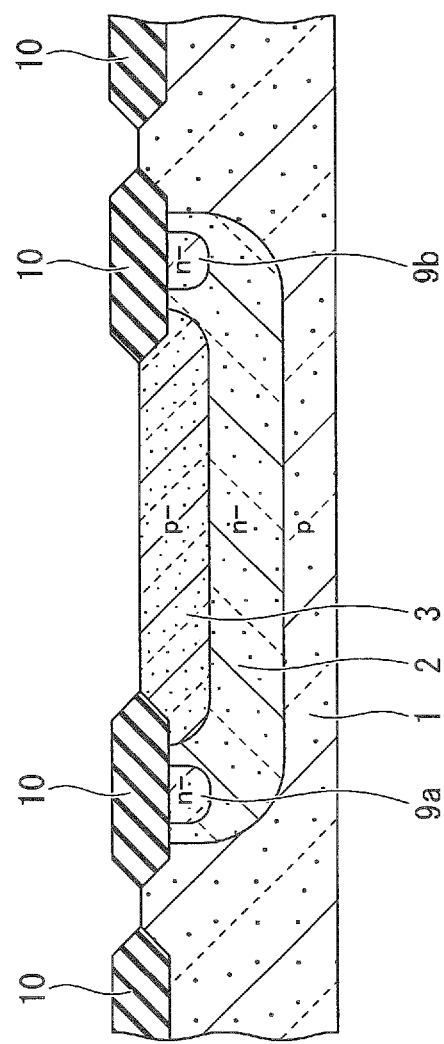
FIG. 10B is a cross-sectional process view continued from FIG. 9B for explaining the method of manufacturing the semiconductor device according to the embodiment of the present invention.
Figure 11A:
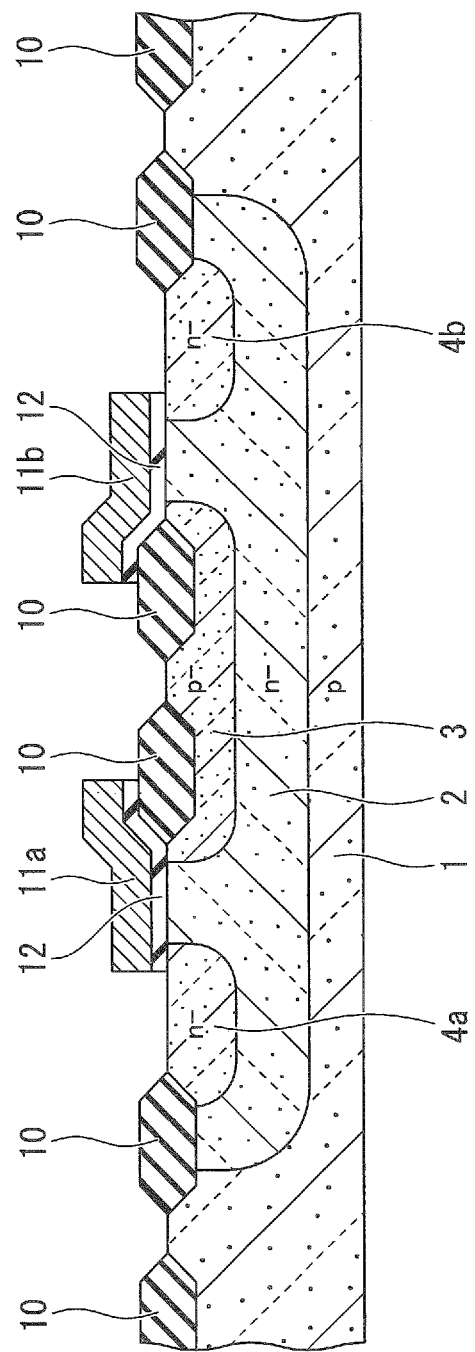
FIG. 11A is a cross-sectional process view continued from FIG. 10A for explaining the method of manufacturing the semiconductor device according to the embodiment of the present invention.
Figure 11B:
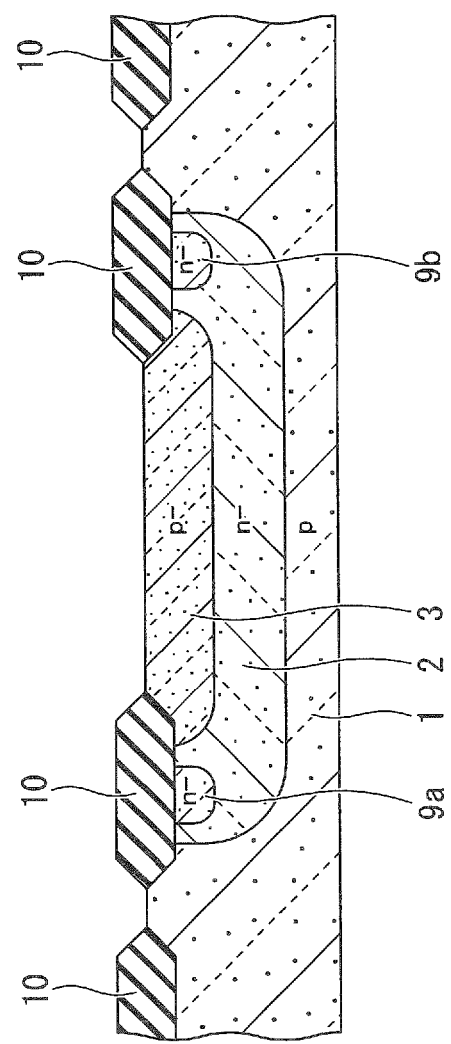
FIG. 11B is a cross-sectional process view continued from FIG. 10B for explaining the method of manufacturing the semiconductor device according to the embodiment of the present invention.

Next, as illustrated in FIG. 10A and FIG. 10B, the element isolation insulating film 10 is formed on the top surface of the semiconductor layer 1 by a LOCOS method, for example. The gate insulating film 12 is then formed on the top surface of the semiconductor layer 1 by a thermal oxidation method or a chemical vapor deposition (CVD) method, for example. The CVD method using dopant gas causes a polysilicon layer (a doped polysilicon layer) to be deposited with which n-type impurity ions or p-type impurity ions are heavily doped. The doped polysilicon layer and the gate insulating film 12 are then selectively removed by photolithography and dry etching. This forms the patterns of the gate insulating film 12 and the gate electrodes 11a and 11b formed of the doped polysilicon layer, as illustrated in FIG. 11A and FIG. 11B.

Figure 12A:
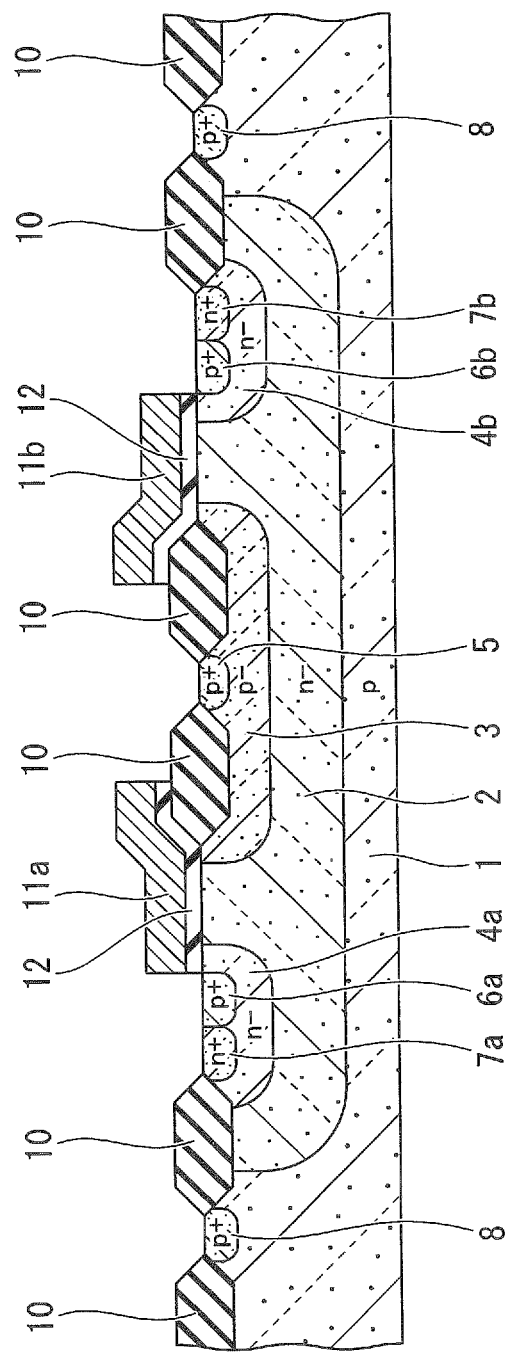
FIG. 12A is a cross-sectional process view continued from FIG. 11A for explaining the method of manufacturing the semiconductor device according to the embodiment of the present invention.
Figure 12B:
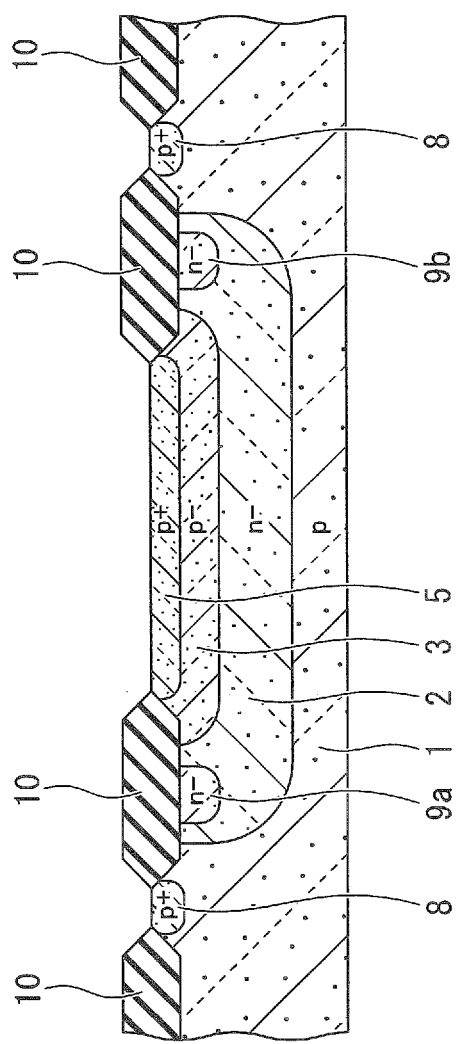
FIG. 12B is a cross-sectional process view continued from FIG. 11B for explaining the method of manufacturing the semiconductor device according to the embodiment of the present invention.

Next, a photoresist film is applied on the top surfaces of the semiconductor layer 1 and the gate electrodes 11a and 11b, and the photoresist film is then delineated by photolithography. Using the delineated photoresist film as a mask, p-type impurity ions such as boron (B) are implanted. After the removal of the photoresist film, another photoresist film is further applied on the top surfaces of the semiconductor layer 1 and the gate electrodes 11a and 11b, and the photoresist film is delineated by photolithography. Using the delineated photoresist film as a mask, n-type impurity ions such as phosphorus (P) are implanted. The execution of the subsequent annealing after the removal of the photoresist film activates the p-type impurity ions and the n-type impurity ions. The $p^+$-type source region 6a and the $n^+$-type contact region 7a are thus formed at the upper parts of the base region 4a, as illustrated in FIG. 12a and FIG. 12B. Similarly, the $p^+$-type source region 6b and the $n^+$-type contact region 7b are formed at the upper parts of the base region 4b. The $p^+$-type drain region 5 is also selectively formed at the upper part of the drift region 3. The $p^+$-type substrate contact region 8 is further selectively formed at the upper part of the semiconductor layer 1.

Next, the interlayer insulating film 13 is deposited to cover the gate electrodes 11a and 11b by a CVD method, for example. The interlayer insulating film 13 is then selectively removed by photolithography and dry etching, for example, so as to form contact holes exposed on the top surfaces of the source regions 6a and 6b, the drain region 5, the contact regions 7a and 7b, and the substrate contact region 8. The contact holes are then filled with a metal film by a sputtering method, photolithography, and dry etching, for example, so as to form the drain electrode 14 connected to the drain region 5, the source electrodes 15 and 16 connected to the source regions 6a and 6b and the contact regions 7a and 7b, and the substrate contact electrodes 17 and 18 connected to the substrate contact region 8. The semiconductor device according to the embodiment of the present invention illustrated in FIG. 1 to FIG. 3 is thus completed.

The method of manufacturing the semiconductor device according to the embodiment of the present invention, which forms the punch-through prevention regions 9a and 9b at the upper parts of the well region 2, can prevent the punch-through between the drain region 5 and the semiconductor layer 1, and also avoid an increase in device area and an increase in chip area, so as to lead to a reduction in manufacturing cost accordingly.

If the ion implantation for forming the punch-through prevention regions 9a and 9b having the same impurity concentration as the base regions 4a and 4b is executed together with the ion implantation step for forming the base regions 4a and 4b so as to form the punch-through prevention regions 9a and 9b simultaneously with the base regions 4a and 4b, the ion implantation conditions that are set to be suitable for the base regions 4a and 4b may be improper for the punch-through prevention regions 9a and 9b. Adding the dedicated photolithography step and ion implantation step so as to adjust the impurity concentration of the punch-through prevention regions 9a and 9b to be suitable for the prevention of the punch-through inevitably leads an increase in cost.

The method of manufacturing the semiconductor device according to the embodiment of the present invention, which forms the openings 22a and 22b for forming the punch-through prevention regions 9a and 9b into slits in the ion implantation step for forming the base regions 4a and 4b, can simultaneously form the base regions 4a and 4b together with the punch-through prevention regions 9a and 9b having the impurity concentration different from the base regions 4a and 4b. This can adjust the impurity concentration of the punch-through prevention regions 9a and 9b to be suitable for the prevention of the punch-through, and enable the manufacture at low cost without adding the dedicated photolithography step or ion implantation step for forming the punch-through prevention regions 9a and 9b.

First Modified Example

Figure 13:
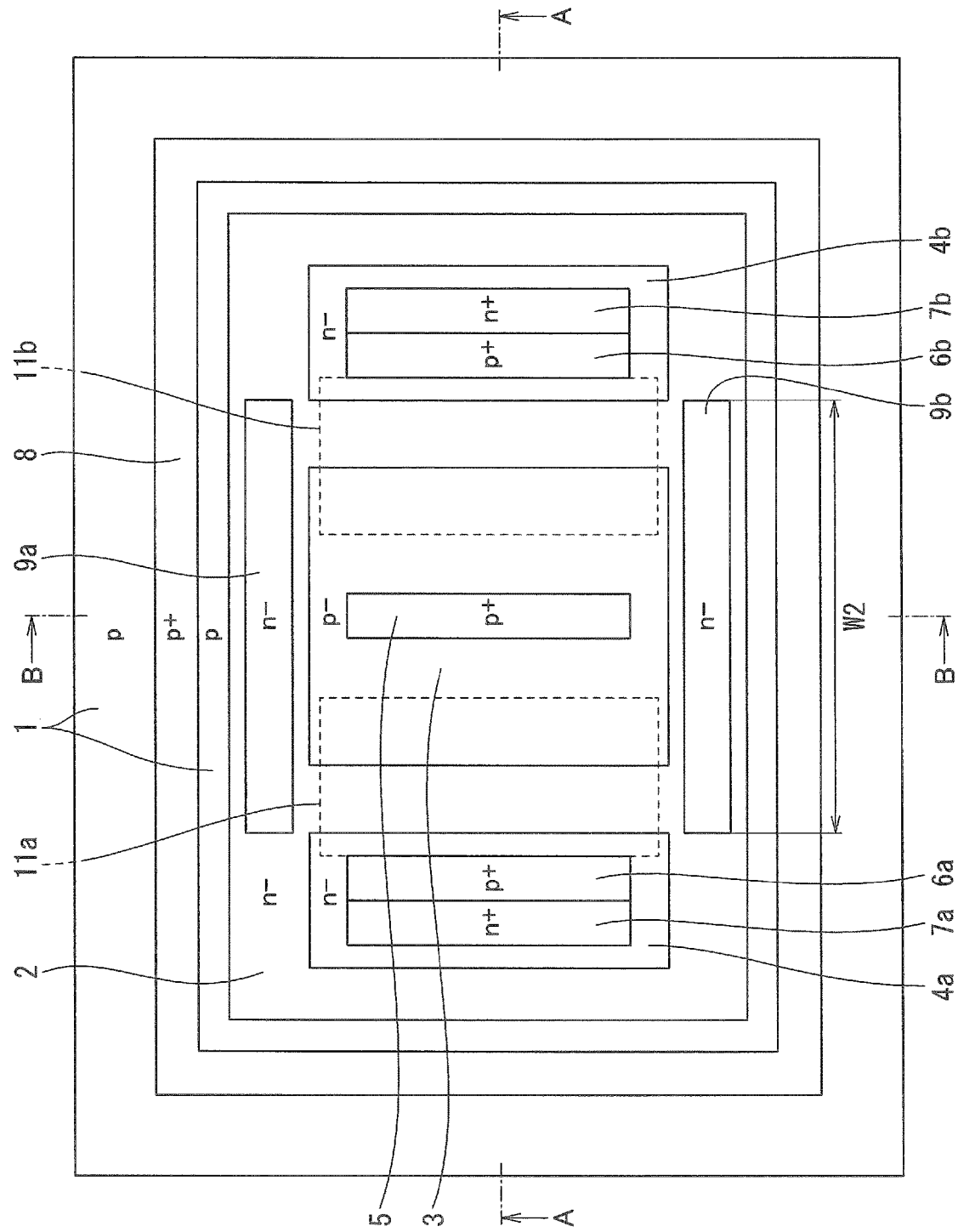
FIG. 13 is a plan view illustrating a semiconductor device according to a first modified example of the embodiment of the present invention.

A semiconductor device according to a first modified example of the embodiment of the present invention differs from the semiconductor device according to the embodiment of the present invention in that the punch-through prevention regions 9a and 9b have a greater width W2 in the right-left direction in FIG. 13. The width W2 of the punch-through prevention regions 9a and 9b is greater than the width of the p⁻-type drift region 3. The other configurations of the semiconductor device according to the first modified example of the embodiment of the present invention are the same as those of the semiconductor device according to the embodiment of the present invention, and overlapping explanations are not repeated below.

The semiconductor device according to the first modified example of the embodiment of the present invention, in which the width W2 of the punch-through prevention regions 9a and 9b is increased, can also achieve the effects similar to those of the semiconductor device according to the embodiment of the present invention.

Figure 14:
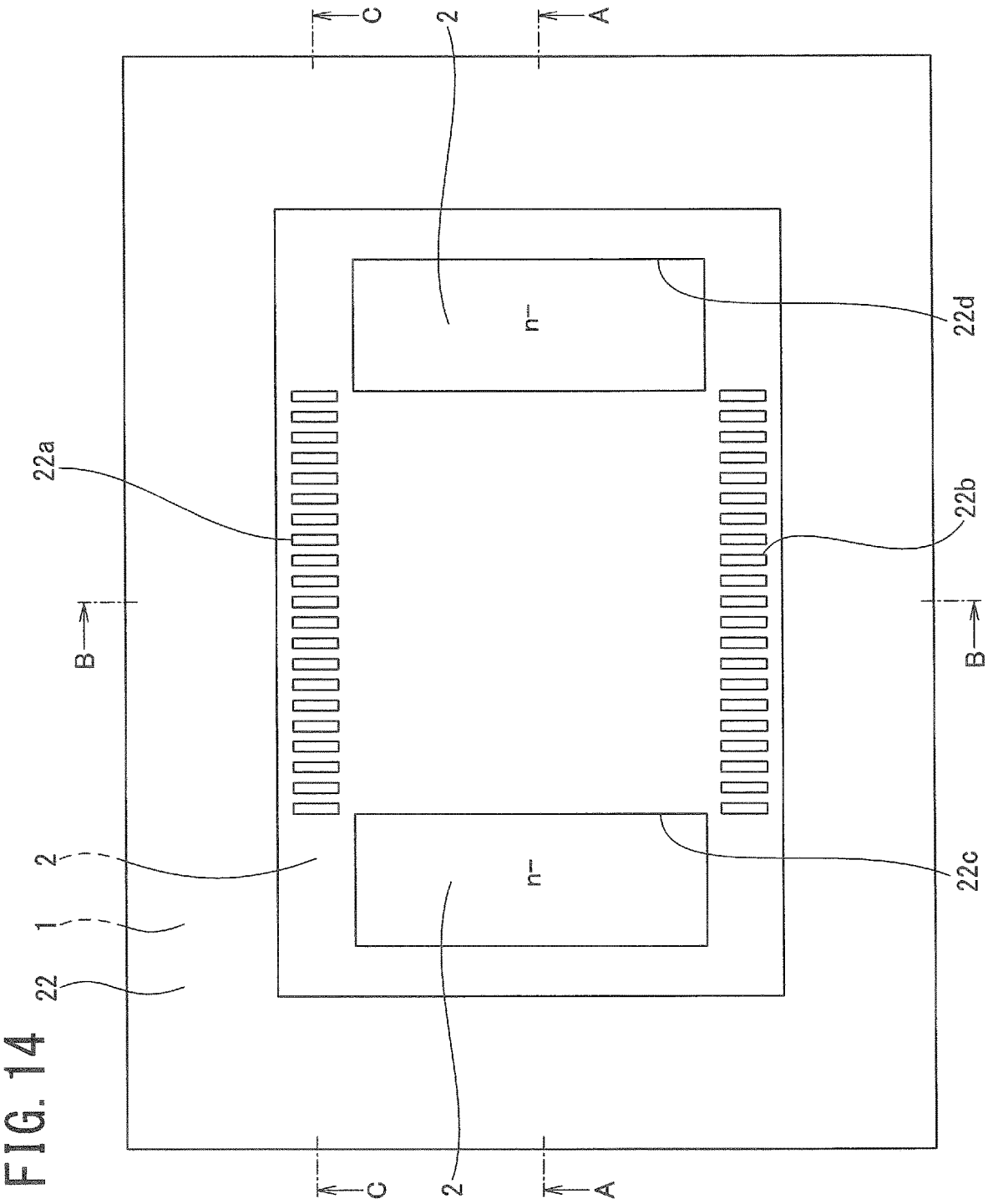
FIG. 14 is a plan view for explaining a method of manufacturing the semiconductor device according to the first modified example of the embodiment of the present invention.

Upon the manufacture of the semiconductor device according to the first modified example of the embodiment of the present invention, the regions of the slit-shaped openings 22a and 22b for forming the punch-through prevention regions 9a and 9b only need to be increased so as to conform to the width W2 of the punch-through prevention regions 9a and 9b when the resist pattern of the photoresist film 22 is formed, as illustrated in FIG. 14.

Second Modified Example

Figure 15:
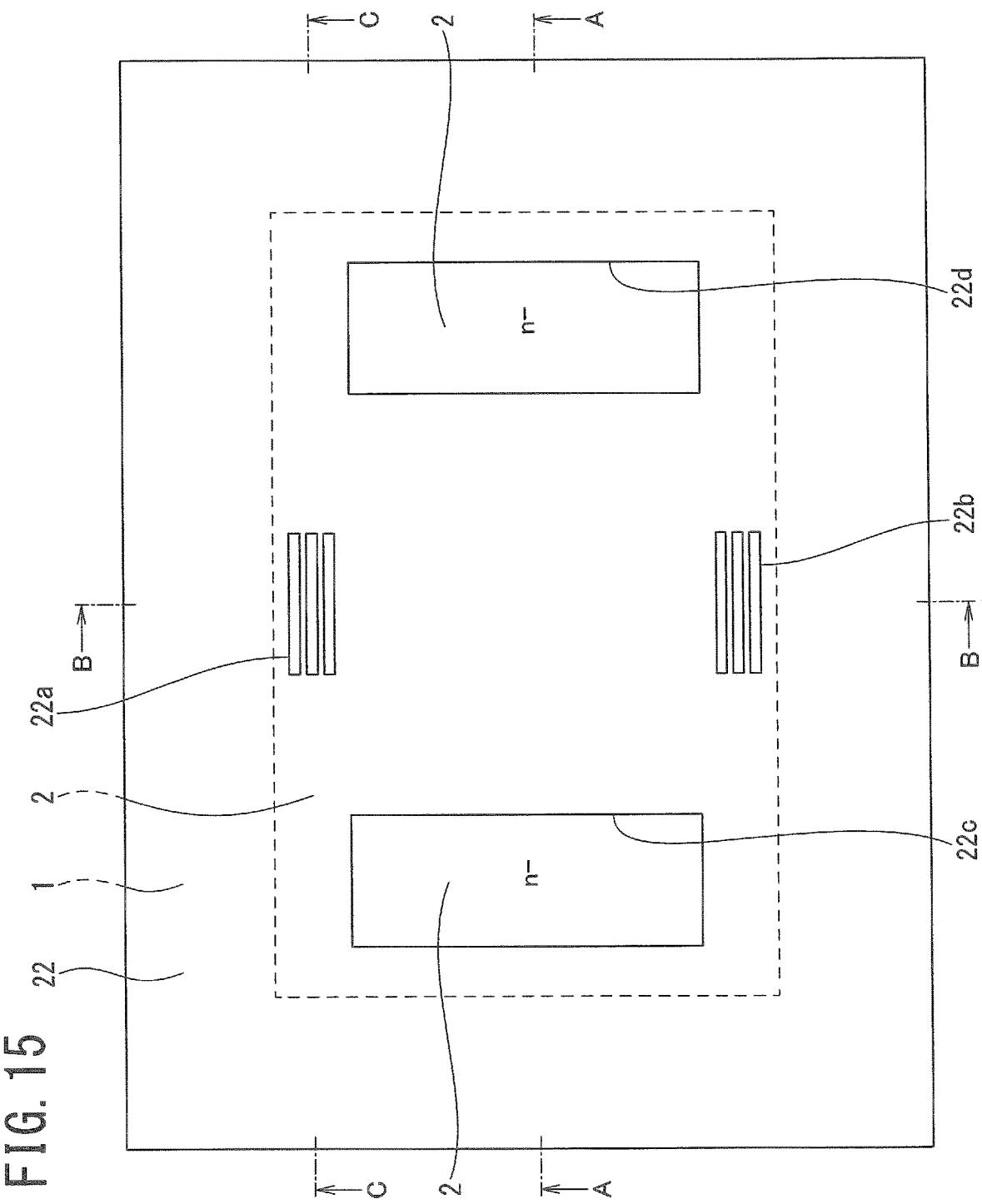
FIG. 15 is a plan view for explaining a method of manufacturing a semiconductor device according to a second modified example of the embodiment of the present invention.

A method of manufacturing a semiconductor device according to a second modified example of the embodiment of the present invention differs from the method of manufacturing the semiconductor device according to the embodiment of the present invention in that the extending direction of the slits of the openings 22a and 22b corresponding to the punch-through prevention regions 9a and 9b is different when the resist pattern of the photoresist film 22 is formed, as illustrated in FIG. 15. The plural slits of the openings 22a and 22b extend in the right-left direction in FIG. 15, and are arranged next to each other in the upper-lower direction in FIG. 15. The other steps of the method of manufacturing the semiconductor device according to the second modified example of the embodiment of the present invention are the same as those of the method of manufacturing the semiconductor device according to the embodiment of the present invention, and overlapping explanations are not repeated below.

The method of manufacturing the semiconductor device according to the second modified example of the embodiment of the present invention, which provides the openings 22a and 22b extending in the other direction to correspond to the punch-through prevention regions 9a and 9b in the photoresist film 22, can also achieve the effects similar to those of the semiconductor device according to the embodiment of the present invention. The shape of the slits of the openings 22a and 22b may be determined as appropriate. The slits may be formed in a diagonal direction, or may be formed into a lattice pattern in which different slits perpendicular to each other are combined together.

Third Modified Example

Figure 16:
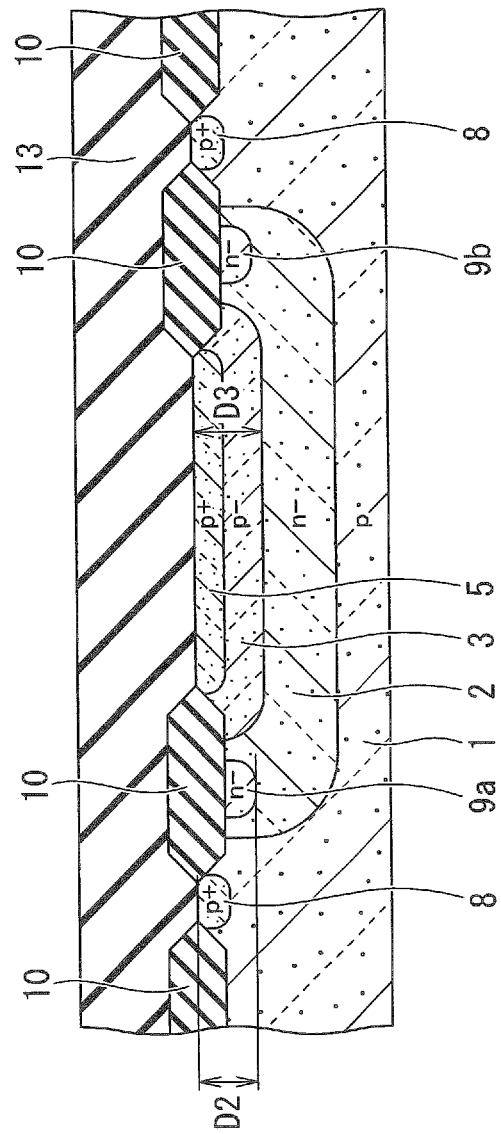
FIG. 16 is a cross-sectional view illustrating a semiconductor device according to a third modified example of the embodiment of the present invention.

A semiconductor device according to a third modified example of the embodiment of the present invention differs from the semiconductor device according to the embodiment of the present invention in that the punch-through prevention regions 9a and 9b have a shallower depth D2, as illustrated in FIG. 16. The depth D2 of the punch-through prevention regions 9a and 9b is shallower than the depth D3 of the drift region 3, and is also shallower than the depth D1 of the bae regions 4a and 4b illustrated in FIG. 2. The other configurations of the semiconductor device according to the third modified example of the embodiment of the present invention are the same as those of the semiconductor device according to the embodiment of the present invention, and overlapping explanations are not repeated below.

The semiconductor device according to the third modified example of the embodiment of the present invention, in which the depth D2 of the punch-through prevention regions 9a and 9b is shallower, can also achieve the effects similar to those of the semiconductor device according to the embodiment of the present invention.

Upon the manufacture of the semiconductor device according to the third modified example of the embodiment of the present invention, regulating the density of the slits of the openings 22a and 22b corresponding to the punch-through prevention regions 9a and 9b can form the punch-through prevention regions 9a and 9b so as to have the shallower depth D2.

Fourth Modified Example

Figure 17:
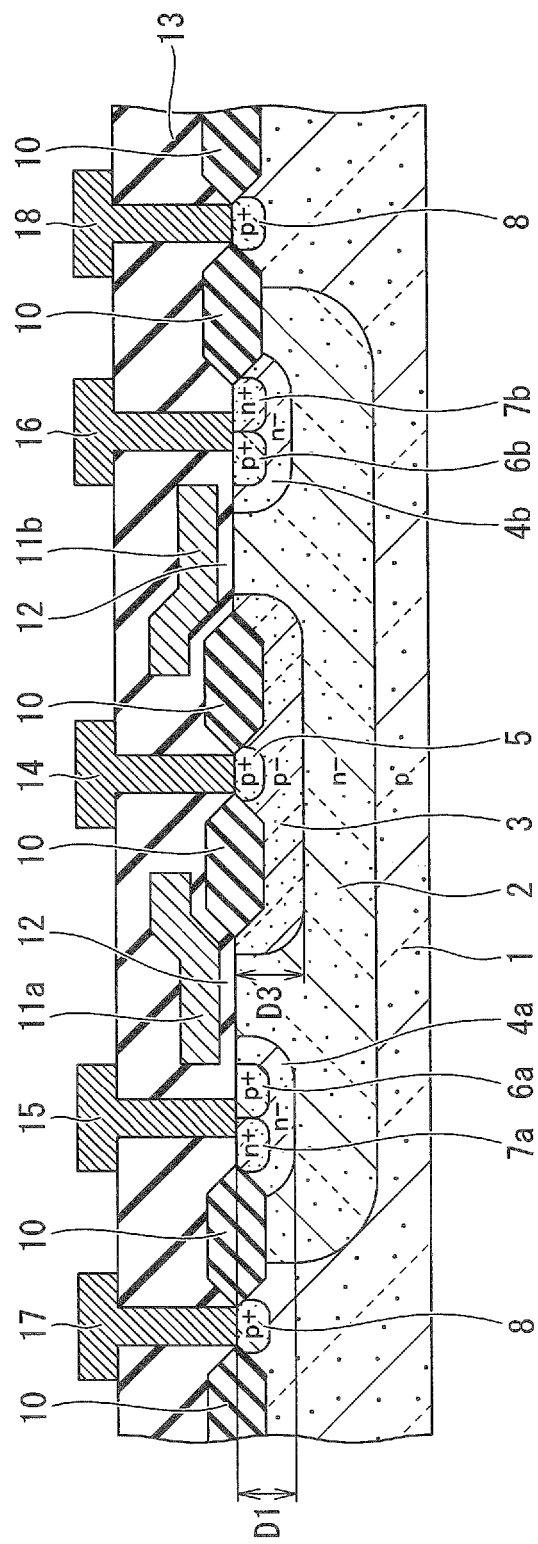
FIG. 17 is a cross-sectional view illustrating a semiconductor device according to a fourth modified example of the embodiment of the present invention.

A semiconductor device according to a fourth modified example of the embodiment of the present invention differs from the semiconductor device according to the embodiment of the present invention in that, as illustrated in FIG. 17, the base regions 4a and 4b have a lower impurity concentration than the punch-through prevention regions 9a illustrated in FIG. 3. As illustrated in FIG. 17, the depth D1 of the base regions 4a and 4b is shallower than the depth D3 of the drift region 3, and is also shallower than the depth D2 of the punch-through prevention regions 9a and 9b illustrated in FIG. 3. The depth D1 of the base regions 4a and 4b may be equal to the depth D3 of the drift region 3, and may be equal to the depth D2 of the punch-through prevention regions 9a and 9b illustrated in FIG. 3. The other configurations of the semiconductor device according to the fourth modified example of the embodiment of the present invention are the same as those of the semiconductor device according to the embodiment of the present invention, and overlapping explanations are not repeated below.

The semiconductor device according to the fourth modified example of the embodiment of the present invention, in which the impurity concentration of the base regions 4a and 4b is different from and lower than the impurity concentration of the punch-through prevention regions 9a and 9b illustrated in FIG. 3, can also achieve the effects similar to those of the semiconductor device according to the embodiment of the present invention.

Figure 18:
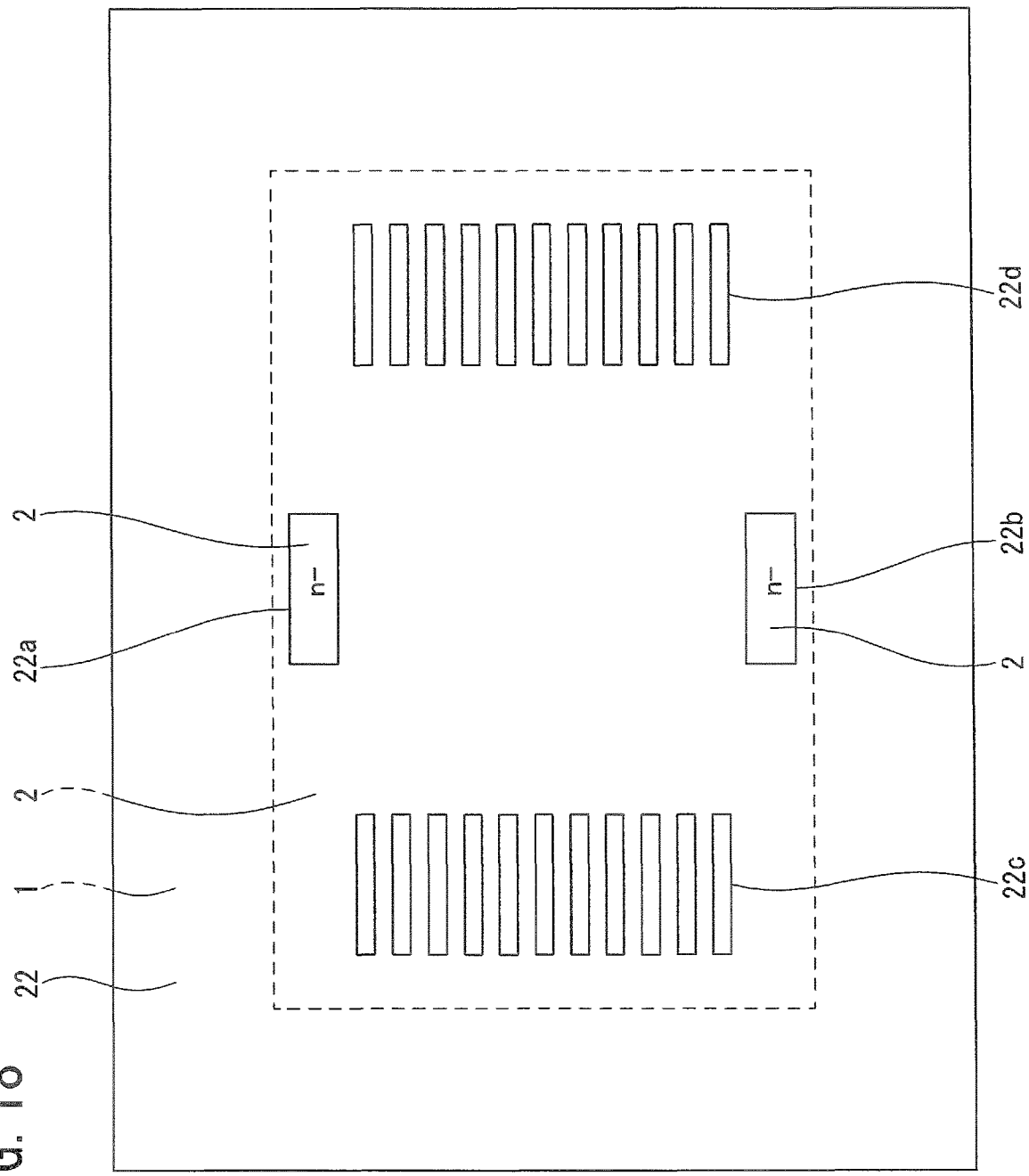
FIG. 18 is a cross-sectional process view for explaining the semiconductor device according to the fourth modified example of the embodiment of the present invention.

Upon the manufacture of the semiconductor device according to the fourth modified example of the embodiment of the present invention, the openings 22a and 22b corresponding to the punch-through prevention regions 9a and 9b are each formed into a rectangular pattern, instead of the plural slits, when the resist pattern of the photoresist film 22 is formed, as illustrated in FIG. 18. The openings 22c and 22d corresponding to the base regions 4a and 4b are formed into plural slits instead.

When the n-type impurity ions are implanted while using the resist pattern of the photoresist film 22 as a mask as illustrated in FIG. 18, the implantation conditions are set so as to be suitable for the formation of the punch-through prevention regions 9a and 9b. The impurity concentration and the depth of the base regions 4a and 4b can be adjusted such that the density of the slits of the openings 22c and 22d is regulated. This can form the base regions 4a and 4b and the punch-through prevention regions 9a and 9b such that the impurity concentration of the base regions 4a and 4b is lower than the punch-through prevention regions 9a and 9b, and the depth D1 of the base regions 4a and 4b is shallower than the depth D2 of the punch-through prevention regions 9a and 9b.

Fifth Modified Example

Figure 19:
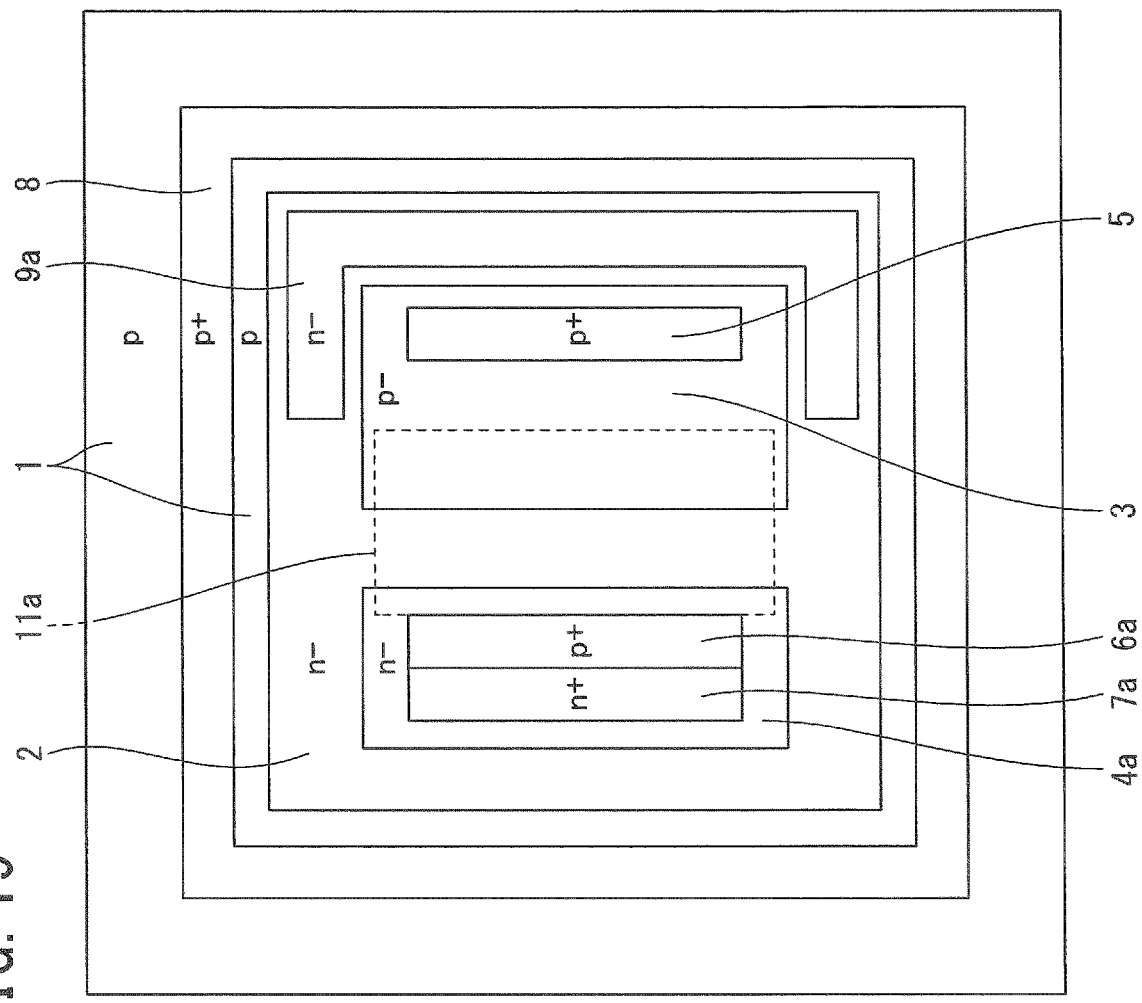
FIG. 19 is a plan view illustrating a semiconductor device according to a fifth modified example of the embodiment of the present invention.

A semiconductor device according to a fifth modified example of the embodiment of the present invention differs from the semiconductor device according to the embodiment of the present invention in including a single LDMOS, as illustrated in FIG. 19. The single LDMOS illustrated in FIG. 19 corresponds to the LDMOS on the left side of the two LDMOSs illustrated in FIG. 1. The punch-through prevention region 9a has a C-shaped planar pattern so as to surround the circumference of the p⁻-type drift region 3. The other configurations of the semiconductor device according to the fifth modified example of the embodiment of the present invention are the same as those of the semiconductor device according to the embodiment of the present invention, and overlapping explanations are not repeated below.

The semiconductor device according to the fifth modified example of the embodiment of the present invention, which includes the single LDMOS, can also achieve the effects similar to those of the semiconductor device according to the embodiment of the present invention.

Upon the manufacture of the semiconductor device according to the fifth modified example of the embodiment of the present invention, the slit of the opening corresponding to the punch-through prevention region 9a only needs to be formed into a C-shaped pattern when the resist pattern of the photoresist film 22 is formed.

Other Embodiments

While the present invention has been described above by reference to the embodiment and the respective modified examples, it should be understood that the present invention is not intended to be limited to the descriptions and the drawings composing part of this disclosure. Various alternative embodiments, examples, and technical applications will be apparent to those skilled in the art according to this disclosure. For example, the respective configurations disclosed in the embodiment and the modified examples of the present invention can be combined together as necessary within a range without contradicting each other.

What is claimed is:

1. A semiconductor device comprising: a semiconductor layer of a first conductivity-type; a well region of a second conductivity-type provided at an upper part of the semiconductor layer; a base region of the second conductivity-type provided at an upper part of the well region and having an impurity concentration higher than an impurity concentration of the well region; a carrier supply region of the first conductivity-type provided at an upper part of the base region; a drift region of the first conductivity-type provided at the upper part of the well region separately from the base region; a carrier reception region of the first conductivity-type provided at an upper part of the drift region and having an impurity concentration higher than an impurity concentration of the drift region; a gate electrode provided on a top surface of the well region interposed between the base region and the drift region via a gate insulating film; and a punch-through prevention region of the second conductivity-type provided at the upper part of the well region and having an impurity concentration higher than the impurity concentration of the well region and different from the impurity concentration of the base region.

2. The semiconductor device of claim 1, wherein the impurity concentration of the punch-through prevention region is lower than the impurity concentration of the base region.

3. The semiconductor device of claim 1, wherein a depth of the punch-through prevention region is shallower than a depth of the base region.

4. The semiconductor device of claim 1, wherein the impurity concentration of the punch-through prevention region is higher than the impurity concentration of the base region.

5. The semiconductor device of claim 1, wherein a depth of the punch-through prevention region is greater than a depth of the base region.

6. The semiconductor device of claim 1, wherein the punch-through prevention region is provided in a region in which the carrier reception region and the well region are opposed to each other in a direction perpendicular to a direction in which the carrier reception region and the carrier supply region are opposed to each other in a planar pattern.

7. The semiconductor device of claim 6, wherein the punch-through prevention region is provided in a region in which the drift region and the well region are opposed to each other in the perpendicular direction in the planar pattern.

8. A method of manufacturing a semiconductor device, the method comprising:
forming a well region of a second conductivity-type at an upper part of a semiconductor layer of a first conductivity-type;
forming a base region of the second conductivity-type having an impurity concentration higher than an impurity concentration of the well region at an upper part of the well region;
forming a punch-through prevention region of the second conductivity-type, at the upper part of the well region, having an impurity concentration higher than the impurity concentration of the well region and different from the impurity concentration of the base region;
forming a drift region of the first conductivity-type at the upper part of the well region separately from the base region;

forming a carrier supply region of the first conductivity-type at an upper part of the base region;

forming a carrier reception region of the first conductivity-type having an impurity concentration higher than an impurity concentration of the drift region at an upper part of the drift region; and forming a gate electrode on a top surface of the well region interposed between the base region and the drift region via a gate insulating film.

9. The method of manufacturing the semiconductor device of claim 8, wherein the forming the base region and the forming the punch-through prevention region include:

forming a resist pattern including a first opening for forming the base region and a second opening having a slit shape for forming the punch-through prevention region;

using the resist pattern as a mask to implant impurity ions of the second conductivity-type; and simultaneously form the base region and the punch-through prevention region having a lower impurity concentration than the base region by annealing.

10. The method of manufacturing the semiconductor device of claim 8, wherein the forming the base region and the forming the punch-through prevention region include:

forming a resist pattern including a first opening having a slit shape for forming the base region and a second opening for forming the punch-through prevention region;

using the resist pattern as a mask to implant impurity ions of the second conductivity-type; and simultaneously form the base region and the punch-through prevention region having a higher impurity concentration than the base region by annealing.

* * * * *